United States Patent [19]

Michel

[11] Patent Number: 5,361,039
[45] Date of Patent: Nov. 1, 1994

[54] POWER AMPLIFIER DEVICE FOR A COMPOSITE SIGNAL

[75] Inventor: Jean Michel, Trappes, France

[73] Assignee: Thomson-LGT Laboratoire General Des Telecommunications, Conflans Sainte Honorine, France

[21] Appl. No.: 78,826

[22] Filed: Jun. 21, 1993

[30] Foreign Application Priority Data

Jun. 26, 1992 [FR] France .................... 92 07890

[51] Int. Cl.$^5$ .................... H03F 19/00; H03G 9/00
[52] U.S. Cl. .................... 330/149; 330/144; 330/150; 327/317; 348/710; 348/707; 348/170
[58] Field of Search .................... 330/149, 144, 150; 307/542; 358/35, 184, 126, 370

[56] References Cited

U.S. PATENT DOCUMENTS 4,682,119 7/1987 Michel .................... 358/35

FOREIGN PATENT DOCUMENTS 0040127 11/1981 European Pat. Off. .
0190073 8/1986 European Pat. Off. .

OTHER PUBLICATIONS

16th European Microwave Conference, Sep. 8-12, 1986, Dublin, Ireland, (Published by Microwave Exhibitions and Publishers Ltd., 1986, pp. 810-815, Tunbridge Wells (GB), Conference Proceedings, J. Czech, "A Linearized L-Band 100 Watt TWT Amplifier for Multicarrier Operation."

Primary Examiner—William L. Sikes
Assistant Examiner—Fetsum Abraham
Attorney, Agent, or Firm—Oblon, Spivak, McClelland, Maier & Neustadt

[57] ABSTRACT

The disclosure relates to the linear power amplification, in a single channel, of a composite signal formed by two independent signals. In a single channel formed by correction means followed by a linear preamplifier followed by a saturated amplifier, the filtering and symmetry effect produced, both in the correction means and in the saturated amplifier, is advantageously used to compensate for clipping of the composite signal due to the amplifier. This makes it possible to obtain an undistorted output signal whose amplitude exceeds the level of saturation of the saturated amplifier. The compensation makes it necessary for the transfer characteristic of the correction means to have a given slope between two points beyond which the saturation appears in the saturated amplifier and a slope that is substantially thrice the given slope on each side of these two points.

1 Claim, 4 Drawing Sheets

POWER AMPLIFIER DEVICE FOR A COMPOSITE SIGNAL

BACKGROUND OF THE INVENTION

The present invention relates to the power amplification of a composite signal, and more specifically to its linear amplification.

The term "composite signal" should be understood to mean a signal formed by a first signal and a second signal that are independent of each other, it being understood that each of the two independent signals may themselves be a composite signals.

There is a known way, for example in television, of carrying out a linear power amplification of a composite signal formed by the image signal and the sound signal. The present invention involves single-channel amplification as opposed to amplification with separate channels where, for example in television, the image and sound signals are amplified by two distinct channels.

To carry out a single-channel linear amplification, there are known ways of using an output amplifier up to its saturation zone but not including the saturation zone, by associating a complementary amplifier with this output amplifier. The complementary amplifier is placed in series before the output amplifier and its transfer characteristic is chosen so as to be complementary to that of the output amplifier, i.e. so that the transfer characteristic of these two amplifiers is a straight line between two points known as saturation points respectively representing the limits of linear amplification of a positive signal and a negative signal. Beyond these points, the gain of the set or unit formed by the two amplifiers is zero or almost zero.

Taking the signal with the greatest amplitude as a first independent signal, the second signal has the effect of shifting the first signal on each side of the position that it would occupy if it were alone. This means that, giving the value 1 to the peak amplitude of the first signal, the composite signal oscillates between two limit values $1+D$ and $-1-D$, where D is the maximum value of shift.

Known linear amplification devices comprise the following in series: the complementary amplifier, a preamplifier and the output amplifier. In order to preserve the linearity of amplification, the power values of the preamplifier and of the output amplifier are increased by a coefficient $(1+D)^2$ in relation to to what is needed to achieve linear amplification of the first independent signal alone.

While the increase in the power of the preamplifier is relatively inexpensive, this is not the case for the output amplifier when the output power values are in the range of tens or even hundreds of kilowatts.

SUMMARY OF THE INVENTION

The aim of the present invention is to reduce the power needed by the output amplifier while at the same time maintaining the linearity of amplification.

This is obtained by the modification, with respect to known devices, of the characteristics of the circuits that precede the output amplifier.

According to the present invention, there is provided an amplification device for carrying a linear power amplification of a composite input signal formed by a first signal and a second signal that are independent of each other, where the second signal has a maximum level at most equal to that of the first signal, said device comprising correction means followed by a preamplifier followed by a saturated amplifier, and having a transfer characteristic that is substantially linearly continuous between two points called saturation points and is substantially constant on each side of these two points, wherein in order that the peak-to-peak amplitude of the first signal at the output of the device may attain the value of the difference in voltage between the two saturation points, the input unit that is formed by the correction means and the preamplifier and provides a filtering and symmetry effect has a transfer characteristic whose curve, not taking account of the filtering and symmetry effect of the input unit, has, between two particular points corresponding to the start of the saturation in the amplification by the saturated amplifier, a given slope and a slope with a value that is substantially three times the value of the given slope on each side of the two particular points.

BRIEF DESCRIPTION OF THE DRAWINGS

The present invention will be understood more clearly and other features will appear from the following description and the figures pertaining thereto, of which.

MORE DETAILED DESCRIPTION

The following description is made in the context of the single-channel amplification of a composite television signal formed by an image signal and a sound signal. Those skilled in the art will be able to adapt the amplification to other composite signals without difficulty.

Figure 1:
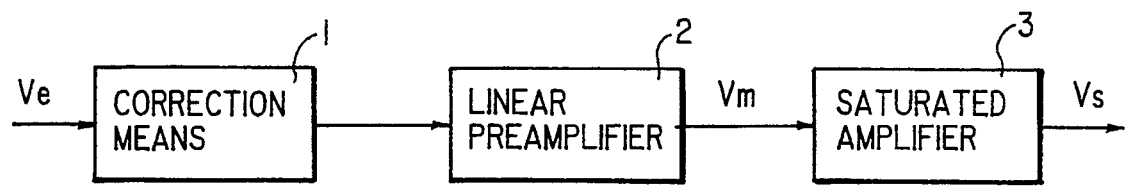
FIG. 1 shows the simplified diagram of a linear power amplification device.

FIG. 1 shows a single-channel linear amplification device constituted by three circuits in series: correction means 1 that receives a signal Ve, followed by a linear preamplifier 2 which is itself followed by a saturated preamplifier that delivers a signal Vs corresponding to the linearly amplified signal Ve.

In the linear amplification devices according to the prior art, the correction means 1 need only have a transfer characteristic such that transfer characteristic of the device is a straight line up to the level of saturation of the output amplifier.

Figure 2:
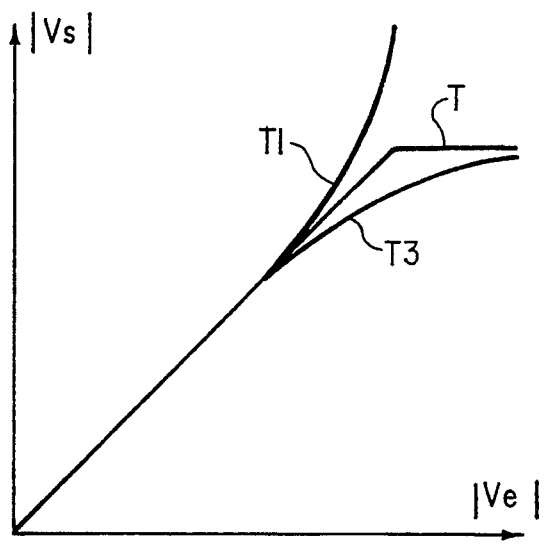
FIG. 2 shows the transfer characteristics of two complementary amplifiers.

FIG. 2 shows the curve T representing the transfer characteristic of the device according to FIG. 1 with the absolute values of the input voltage Ve on the x-axis and the absolute values of the output voltage Vs on the y-axis. This transfer characteristic is obtained by two complementary amplifiers placed in series: the correction means 1 and the saturated amplifier 3 whose gains in voltage are given respectively by the slopes of a curve T1 and a curve T3. The product of these gains is kept constant up to the saturation zone of the saturated amplifier but not including the saturation zone, to have a linear amplification. In the saturation zone, since the gain of the saturated amplifier tends towards zero, the gain of the correction means would have to tend towards infinity to maintain the linearity of amplification, which is impossible. The curve T therefore has a portion of constant slope with a value of non-zero followed by a portion of slope with a value of zero beyond a point corresponding to the start of the saturation of the saturated amplifier 3.

Figure 3:
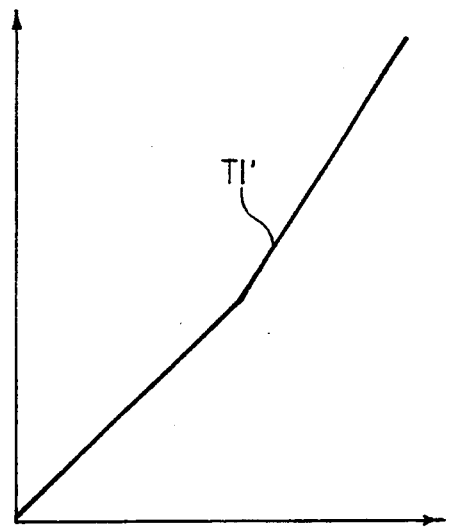
FIGS. 3 and 4 respectively show the transfer characteristics of a complementary amplifier.

In fact, the shape of the curve T1 is not exactly a shape complementary to that of the curve T3 shown in FIG. 2, for it is obtained by an approximation of this complementary shape by means of a jagged or broken line formed by straight-line segments. A jagged line such as this, T1', is shown in FIG. 3. To simplify the explanations, the curve according to FIG. 3 has only two straight-line segments.

Figure 4:
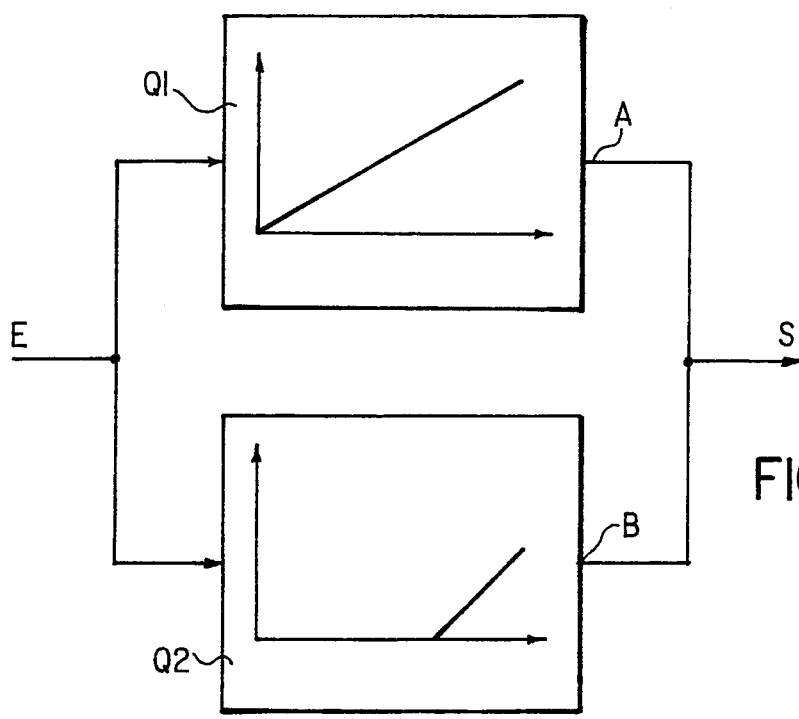

The transfer characteristic according to the curve of FIG. 3 is obtained by an assembly shown in FIG. 4: this assembly is constituted by the parallel connection of two quadripoles Q1, Q2 of which one, Q1, is linear, i.e. it works in class A mode, while the other, Q2, has an off state followed by a linear state, i.e. it works in class C mode. These two quadripoles receive the same signal at their common input E and have their respective outputs A and B connected to a same common output S.

The rest of the description shall make reference, by way of a non-restrictive example, to the amplification of a composite television signal formed by an image signal and a sound signal, and this composite signal will be represented in the figures by its envelope.

Figure 5:
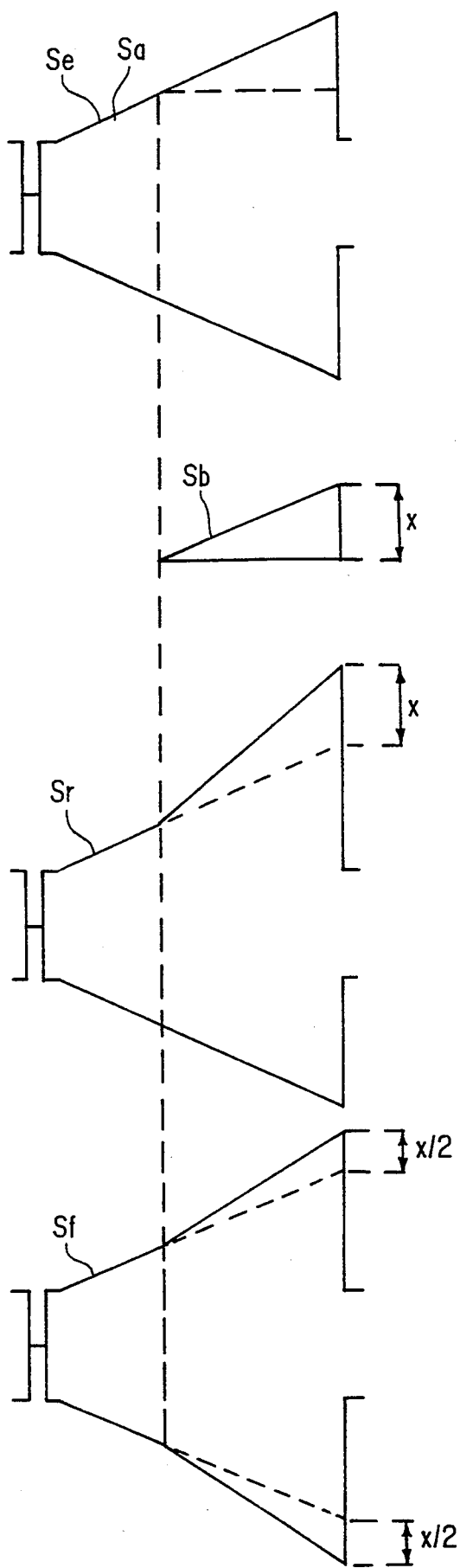
FIG. 5 shows the shapes of signals relating to a complementary amplifier.

FIG. 5 shows four signals Se, Sb, Sr and Sf. The signal Se is the television image signal. It is applied to the input E of the assembly according to FIG. 4, and this same signal is recovered at the output A of the quadripole Q1, not counting the linear amplification given by this quadripole. The signal Sb is the signal at the output B of the quadripole Q2; the maximum amplitude of the signal Sb is referenced x in the figure.

The shape of the signal at the point S of the assembly according to FIG. 4 differs according to the way in which the summation of the signals given by the quadripoles Q1 and Q2 is done. If the assembly is a wideband assembly and therefore gives results that would be given by summation in a resistor, then the signal at the output S is represented by the signal Sr of FIG. 5. This is a signal that has lost the symmetry of the input signal Se owing to the summation made.

The symmetry may be recovered by applying the signal Sr to the input of a filter. Indeed, since the signal Se at the input E of the assembly according to FIG. 4 is a signal modulated by a sawtoothed video signal, the spectrum of the signal Sr is formed by the fundamental spectrum of the modulated signal Se, by harmonics and above all by the spectrum of the modulating signal regenerated by the non-linearity of the assembly. The elimination of the modulating signal can be done by the filtering of the fundamental spectrum in this signal Sr; this filtering gives the signal Sf of FIG. 5.

It has to be noted that, in radio frequency amplifiers, the model of Which is also the association of two quadripoles according to FIG. 4, it is not possible to find a signal of the same type as the signal Sr of FIG. 5, for the load and the filtering are closely related in such amplifiers. Indeed, the output matching circuits of these amplifiers are impedance transformers with a passband that is sufficient to meet the requirements of the fundamental spectrum, but the limits of this passband naturally eliminate the modulating spectrum and the harmonics.

The signal Sf according to FIG. 5 is a symmetrical signal. However, it does not reproduce the shape of the input signal Se, i.e. the amplification is not linear. To prevent this non-linearity, there are known ways of making the saturated amplifier and the correction means work only in the rectilinear part of their transfer characteristic which passes through the zero point of the graph.

Figure 6:
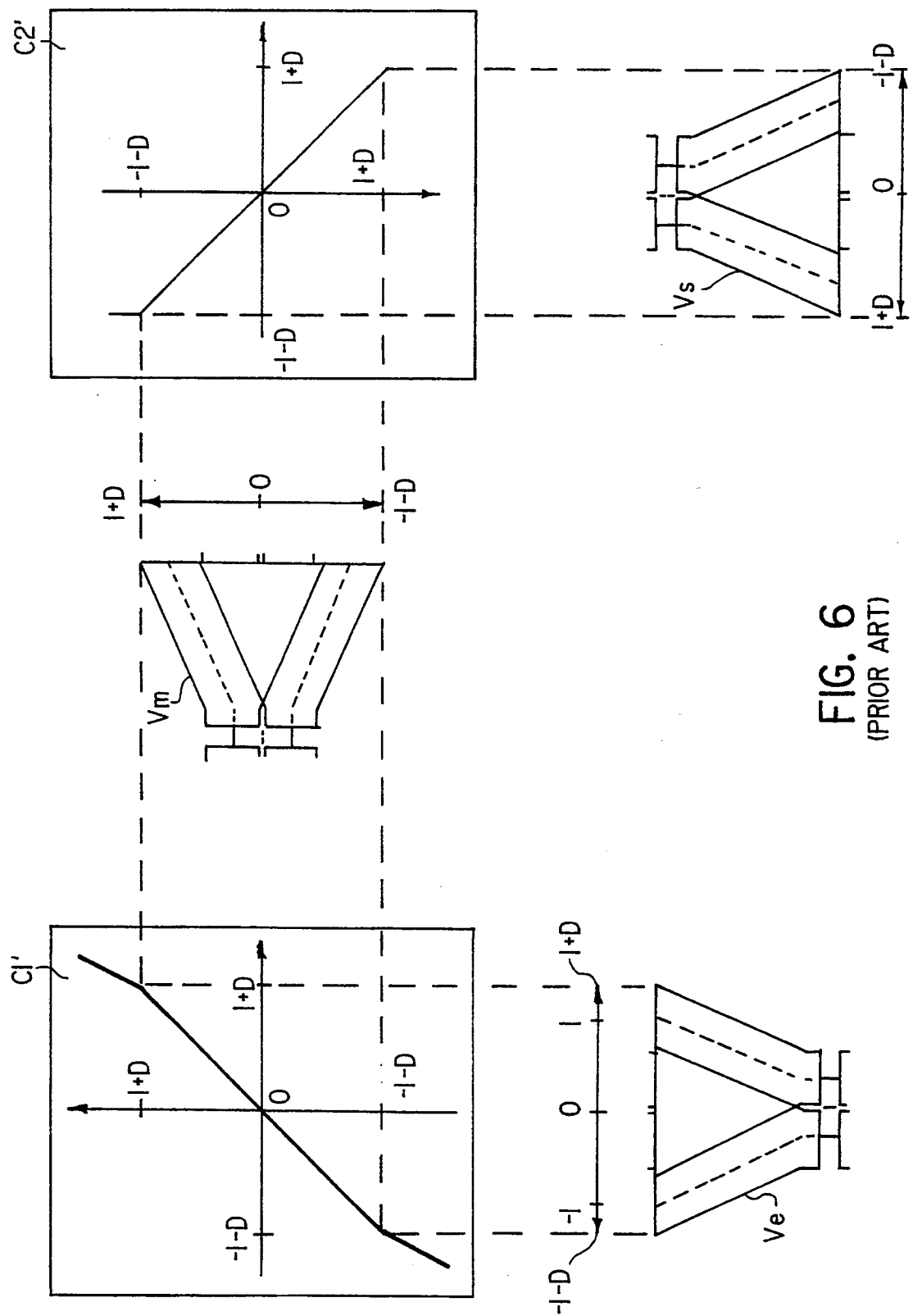
FIGS. 6 and 7 are drawings showing the changes undergone by the signals as and when they move ahead, respectively in a device according to the prior art and a device according to the invention.

This known technique is illustrated by means of FIG. 6 where the input signal Ve of the device according to FIG. 1 is shown by means of solid lines at the furthermost positions that it occupies and by means of dashes at its mean position. The mean position corresponds to the image signal alone. The sound signal shifts the image signal in a sinusoidal movement with an amplitude D where, by giving the amplitude of the envelope of the image signal the value 1, the value D is equal to the ratio of the image level to the sound level. In FIG. 6, as well as in FIG. 7 and hereinafter, the values 1 and D correspond to amplitudes at given points of the amplification device and, for example, the value 1 is attributed to the amplitude of the image signal alone, at input as well as at output and at any point of the device, it being understood that, for example, the value $1+D$ of the output signal of the device corresponds to the value $1+D$ of the input signal only when the amplification given by the device is not taken into account.

Irrespective of the shift, i.e. even for the extreme values, the composite signal is always amplified in the linear part of the characteristic of the amplifier, whether by the correction means or by the saturated amplifier, it being understood that, by definition, this is also the case in the linear preamplifier 2 according to FIG. 1. Thus, according to FIG. 6, the input signal Ve undergoes a first linear amplification, according to a transfer characteristic C1' to give a signal Vm that undergoes a second linear amplification, according to a transfer characteristic C2', in the saturated amplifier, to give the output signal Vs. In FIG. 6, as in FIG. 7, to simplify the understanding of the invention, the characteristic of the saturated amplifier has been drawn as if it had no need of correction. This in no way changes the explanations given, the shape of the transfer characteristics shown being only slightly modified in relation to reality and the differences in shape being compensated for between the transfer characteristics of the first and second amplifications.

As can be seen in FIG. 6, owing to the shift D, the amplification device must give an output power that is multiplied by $(1+D)^2$ in relation to what is necessary to amplify the image signal alone, and the peak output power, Pc, of the composite signal is equal to the saturation power, Psat, of the amplifier:

Pc=Psat

Figure 7:
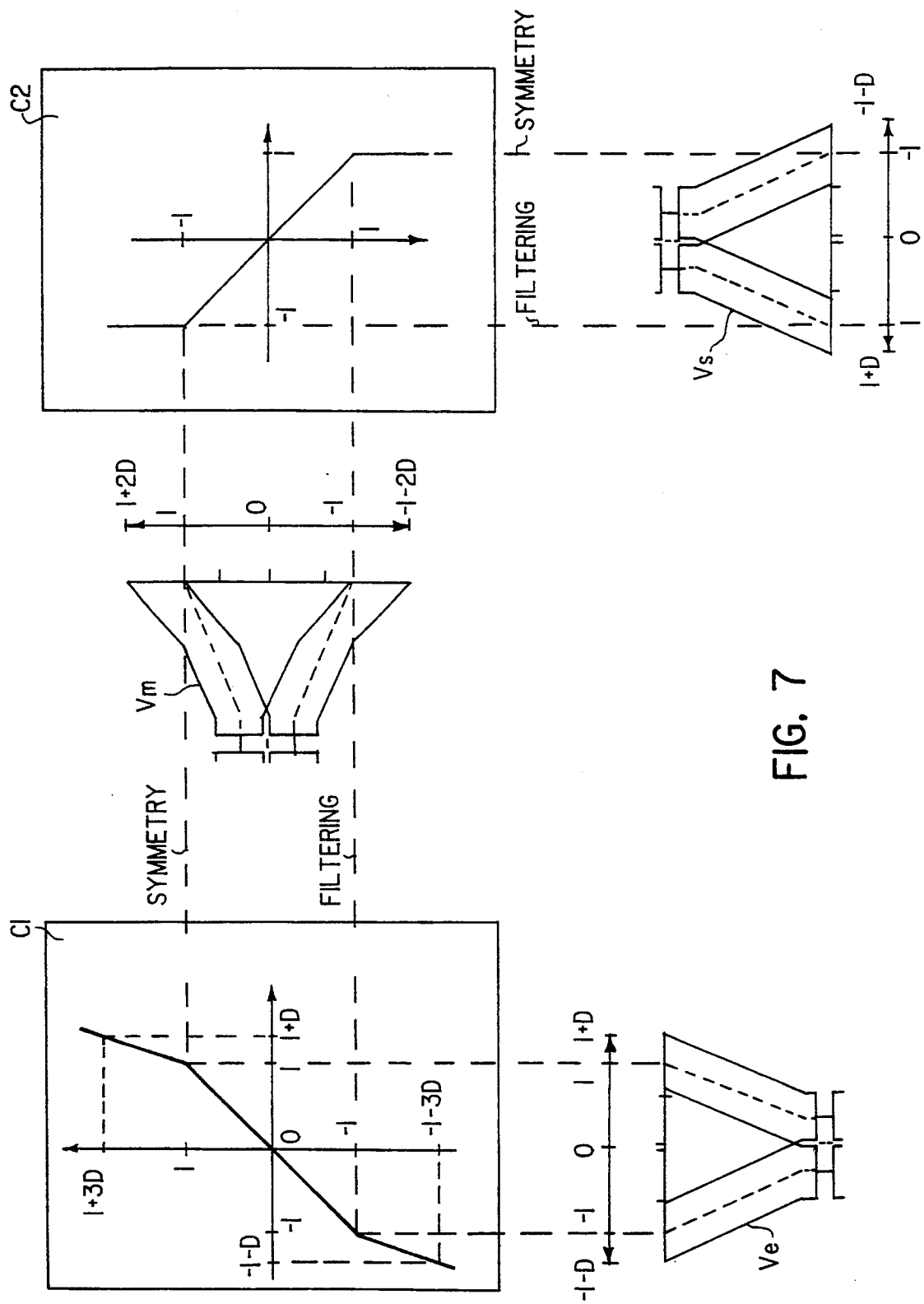

FIG. 7 shows how the device can be modified to obtain:

Pc=nPsat where n belongs to the set of real numbers and where $1 < n \geq 4$.

This is obtained by taking advantage of the associated effects of filtering and symmetry referred to further above, especially in the description made with reference to FIG. 5. With regard to both the first amplification, i.e. before the saturated amplifier, and the second amplification done by the saturated amplifier, the modification consists in accepting operation, under certain conditions, beyond the bend of the transfer characteristics.

If the saturated amplifier is used beyond the saturation, a part of the signal will be clipped because of the saturation but could be regenerated by the filtering and symmetry effect, on two conditions:

1. At most, half of the signal must be clipped when the shift is the maximum;
2. The part of the signal that is clipped should be reconstituted with precision by filtering and symmetry.

The first condition is satisfactory with a saturation voltage, Vsat, a shift, D, and an amplitude, 1, of the image signal alone, that are equal:

$$V_{sat} = D = 1$$

with, here again, the value 1 assigned to the maximum amplitude of the image signal alone.

The second condition makes it necessary that, in the transfer characteristic of the first amplification, i.e. the amplification other than that of the saturated amplifier, the slope is tripled beyond the points $(1,1)$ $(-1,-1)$ in relation to its value between these points.

As was seen in FIG. 6, the input signal Ve underwent a first linear amplification for values ranging from $-1-D$ to $1+D$, i.e. for all the values of this signal irrespective of the shifting due to the sound signal. The signal Vm obtained by this first amplification underwent a second amplification to give the output signal Vs; this second amplification obtained by means of the saturated amplifier was linear for all the values of this signal Vm ranging from $-D-1$ to $D+1$, i.e. for all the values of the signal Vm irrespective of the shift brought about by the sound signal.

As can be seen in FIG. 7, which pertains to the invention, the first and second amplifications are no longer linear throughout the range of the voltages to be amplified. The signal Ve undergoes a first amplification, according to a transfer characteristic C1, which is linear for the values of Ve ranging from $-1$ to $+1$ but then has a bend with a slope that has a value three times the value that it had between $-1$ and $+1$; and, for example, for the shift $+D$ where the maximum and minimum voltages of the signal Ve are respectively $1+D$ and $-1-D$, the corresponding maximum and minimum values of the signal Vm, which would be $1+3D$ and $-1+D$ without the filtering and symmetry effect, are equal to $1+2D$ and $-1$. As for the signal Vm, it undergoes the second amplification, according to a transfer characteristic C2 which is linear for the values of Vm ranging from $-1$ to $+1$ and has zero gain, owing to the saturation, for all the values of Vm greater than 1 in terms of absolute value. And, although the signal Vm has been distorted and has undergone the effect of filtering and symmetry, for its values ranging between 1 and $1+2D$ and between $-1$ and $-1-2D$, during the first amplification, the signal Vs at the output of the saturated amplifier appears as if the signal Ve had undergone a linear amplifier throughout the length of the single channel constituted by the device; as indicated here above, this is due to the effect of filtering and symmetry of the saturated amplifier and to the compensation effect obtained in what has been called the first amplification.

What is claimed is:

1. A linear power amplification device for linearly amplifying a composite input signal formed of first and second independent signals, a maximum level of said second independent signal being less than or equal to a maximum level of said first independent signal, said linear power amplification device comprising:

correction means for receiving said composite input signal;

preamplifier means coupled to said correction means to thereby force an input unit, said preamplifier means receiving an output of said correction means; and saturated amplifier means coupled to said preamplifier means and receiving an output thereof, said saturated amplifier means exhibiting a first saturation level representing a lowest positive input voltage level for which a corresponding output voltage level is not linear, and a second saturation level representing a greatest negative input voltage level for which a corresponding output voltage level is not linear, wherein a transfer characteristic of said linear power amplification device is substantially linear for levels of said composite input signal between said first saturation level and said second saturation level and is substantially constant for levels of said composite input signal not between said first saturation level and said second saturation level and wherein a transfer characteristic of said input unit exhibits a given slope for levels of said composite input signal between said first saturation level and said second saturation level and exhibits a slope substantially three times as great as said given slope for levels of said composite input signal not between said first saturation level and said second saturation level so that a peak-to-peak amplitude of said first independent signal upon linear amplification by said linear power amplification device is equal to a difference in voltage between said first saturation level and said second saturation level.

* * * * *